(12) United States Patent
Bennett (10) Patent No.: US 8,832,524 B2
(45) Date of Patent: Sep. 9, 2014

(54) SYSTEM AND METHOD FOR CORRECTING ERRORS IN DATA USING A COMPOUND CODE

(71) Applicant: Jon C. R. Bennett, Sudbury, MA (US)

(72) Inventor: Jon C. R. Bennett, Sudbury, MA (US)

(73) Assignee: Violin Memory, Inc., Santa Clara, CA (US)

( * ) Notice: Subject to any disclaimer, the term of this patent is extended or adjusted under 35 U.S.C. 154(b) by 0 days.

(21) Appl. No.: 13/624,282

(22) Filed: Sep. 21, 2012

(65) Prior Publication Data

US 2013/0080862 A1 Mar. 28, 2013

Related U.S. Application Data (60) Provisional application No. 61/537,662, filed on Sep. 22, 2011, provisional application No. 61/537,665, filed on Sep. 22, 2011.

(51) Int. Cl.
*H03M 13/00* (2006.01)
*H03M 13/29* (2006.01)
*G06F 11/10* (2006.01)
*H03M 13/15* (2006.01)
*H03M 13/11* (2006.01)

(52) U.S. Cl.
CPC ....... *G06F 11/1072* (2013.01); *H03M 13/2906* (2013.01); *H03M 13/152* (2013.01); *H03M 13/1102* (2013.01)
USPC .......... 714/755; 714/752; 714/758; 714/763; 714/773; 714/776; 714/782

(58) Field of Classification Search
USPC ................................. 714/773, 782
See application file for complete search history.

(56) References Cited

U.S. PATENT DOCUMENTS

| 3,652,998 | A | | 3/1972 | Forney, Jr. |
| 4,559,625 | A | | 12/1985 | Berlekamp et al. |
| 5,136,588 | A | | 8/1992 | Ishijima |
| 5,224,106 | A | * | 6/1993 | Weng ............................ 714/755 |
| 7,080,309 | B2 | * | 7/2006 | Sharma ......................... 714/763 |
| 7,237,171 | B2 | | 6/2007 | Richardson |
| 7,237,174 | B2 | | 6/2007 | Eroz et al. |

(Continued)

OTHER PUBLICATIONS

Andersen, Jakob Dahl, "A Turbo Tutorial," Dept. of Telecommunications, Technical Univ. of Denmark, date unknown, 21 pages.

(Continued)

*Primary Examiner* — Albert Decady
*Assistant Examiner* — Justin R Knapp
(74) *Attorney, Agent, or Firm* — Brinks Gilson and Lione (57) ABSTRACT

Storage of digital data in non-volatile media such as NAND FLASH needs to take account of the errors in data retrieved from the memory. The error rate tends to increase with the number of write/erase cycles of a cell of memory and with the time that the data has been stored. To achieve a very low uncorrected bit error rate (UBER) a substantial amount of redundancy data needs to be stored for error correction purposes. A method and apparatus is disclosed where a first redundancy data is represented by a second redundancy data computed from the first redundancy data. The first redundancy data may not be stored and is reconstructed from the stored data using a same generation procedure as previously used. The reconstructed estimate of the first redundancy data is corrected by the second redundancy data, and is used to correct the underlying data.

21 Claims, 3 Drawing Sheets

(56) References Cited

U.S. PATENT DOCUMENTS

| | | | |
|---|---|---|---|
| 7,281,006 | B2 | 10/2007 | Hsu et al. |
| 7,774,688 | B1 | 8/2010 | Teng et al. |
| 7,900,117 | B2 | 3/2011 | Kanno |
| 7,941,598 | B2 | 5/2011 | Kaneda et al. |
| 2002/0184590 | A1* | 12/2002 | Ramaswamy et al. ........ 714/752 |
| 2003/0007487 | A1* | 1/2003 | Sindhushayana et al. .... 370/390 |
| 2008/0104459 | A1 | 5/2008 | Uchikawa et al. |
| 2009/0234892 | A1 | 9/2009 | Anglin et al. |
| 2009/0271454 | A1 | 10/2009 | Anglin et al. |
| 2009/0287956 | A1 | 11/2009 | Flynn et al. |
| 2010/0058152 | A1 | 3/2010 | Harada |
| 2010/0162055 | A1 | 6/2010 | Morita et al. |
| 2010/0169551 | A1 | 7/2010 | Yano et al. |
| 2010/0223538 | A1 | 9/2010 | Sakurada |
| 2010/0253555 | A1 | 10/2010 | Weingarten et al. |
| 2010/0262898 | A1 | 10/2010 | Ikuta et al. |
| 2010/0313099 | A1 | 12/2010 | Yamaga |
| 2011/0083060 | A1 | 4/2011 | Sakurada et al. |

OTHER PUBLICATIONS

Baldi, Marco et al., "LDPC Codes Based on Serially Concatenated Multiple Parity-Check Codes," IEEE Communications Letters, vol. 13, No. 2, Feb. 2009, pp. 142-144.

Boboila, Simona et al., "Write Endurance in Flash Drives: Measurements and Analysis," FAST'10 Proceedings of the 8th USENIX conference on file and storage technologies, 2010, 14 pages.

Chilappagari, Shashi Kiran et al., "Guaranteed Error Correction Capability of Codes on Graphs," Information Theory and Applications Workshop, 2009, pp. 50-55.

Deal, Eric, "Trends in NAND Flash Memory Error Corrections," Cyclic Design, Jun. 2009, 11 pages.

Gabrys, Ryan et al., "Extending Flash Memory Lifetime Using Coding Techniques," Slideshow presentation, Flash Memory Summit, Santa Clara, CA, 2011, 19 pages.

Gallager, R.G., "Low-Density Parity-Check Codes," IRE Transactions on Information Theory, Jan. 1962, pp. 21-28.

Gallager, Robert G., "Low-Density Parity-Check Codes," 1963, 90 pages.

Lee, Sang Hoon et al., "The Effect of Block Interleaving in an LDPC-Turbo Concatenated Code," ETRI Journal, vol. 28, No. 5, Oct. 2006, pp. 672-675.

Mohamed, Albashir A. et al., "Bootstrapped Low Complexity Iterative Decoding Algorithm for Low-Density Parity-Check (LDPC) Codes," Canadian Journal on Electrical & Electronics Engineering, vol. 1, No. 1, Feb. 2010, pp. 10-14.

Motwani, Ravi et al., "Low Density Parity Check (LDPC) Codes and the Need for Stronger ECC," Intel, Aug. 2011, 18 pages.

Shi, Zhiping et al., "Iterative Decoding for the Concatenation of LDPC Codes and BCH Codes Based on Chase Algorithm," 6th International Conference on ITS Telecommunications Proceedings, 2006, pp. 12-15.

Shokrollahi, Amin, "LDPC Codes: An Introduction," Digital Fountain, Inc., Fremont, CA, Apr. 2, 2003, 34 pages.

Spagnol, Christian et al., "Quasi-cyclic Low Density Parity Check codes with high girth," Summer Doctoral School 2009, Groebner bases, Geometric codes and Order Domains, Dept. of Mathematics, Univ. Of Trento, Italy, Jun. 10, 2009, 49 pages.

Tee, R.Y.S. et al., "Generalized Low-Density Parity-Check Coding Aided Multilevel Codes," IEEE VTC'06, Melbourne, Australia, May 2006, 5 pages.

Unknown author, "Architecture Customized Constrained Coding for Mitigating FG coupling in Flash," Slideshow presentation, NVM Solutions Group, Intel Corp., Santa Clara, CA, Aug. 2011, 21 pages.

Unknown author, "NAND Flash ECC Algorithm (Error Checking & Correction)," Slideshow presentation, Product Planning & Application Engineering Team, Memory Division, Samsung Electronics Co., Jun. 2004, 8 pages.

Weingarten, Hanan, "Advanced Management for 3bpc NAND Flash devices," Slideshow presentation, DensBits Technologies, Flash Memory Summit, Santa Clara, CA, 2011, 18 pages.

Williams, David, Advanced Hardware Architecture, Inc., "Turbo Product Code Tutorial," Slideshow presentation, IEEE 802.16 Session #7, May 2000, 64 pages.

Yaakobi, Eitan et al., "Error Characterization and Coding Schemes for Flash Memories," IEEE Globecom 2010 Workshop on Application of Communication Theory to Emerging Memory Technologies, 2010, 5 pages.

Yang, Jeff, Principle Engineer, Silicon Motion, Inc., "High-Efficiency SSD for Reliable Data Storage Systems," Silicon Motion, Flash Memory Summit, Santa Clara, CA, 2011, 18 pages.

Yu, Allen, "Improving NAND Reliability with Low-Density Parity Check Codes (LDPC)," Phison, Flash Memory Summit, Santa Clara, CA, 2011, 10 pages.

Zhang, Fan et al., "LDPC Codes for Rank Modulation in Flash Memories," ISIT 2010, Austin, Texas, Jun. 2010, pp. 859-863.

International Search Report for International Application No. PCT/US2012/056534, dated Feb. 15, 2013, 2 pages.

Written Opinion of the International Searching Authority for International Application No. PCT/US2012/056534, dated Feb. 15, 2013, 4 pages.

* cited by examiner

SYSTEM AND METHOD FOR CORRECTING ERRORS IN DATA USING A COMPOUND CODE

This application claims the benefit of priority to U.S. 61/537,662 and 61/537,665, which were filed on Sep. 22, 2011 and are incorporated herein by reference in their entirety.

BACKGROUND

When data is transmitted over a transmission medium to a receiving location, the data may be received in error due to a myriad of causes. Amongst the causes of error are random noise in the channel, bursts of strong noise, drift and nonlinearities in the demodulator, or the like. A broad field of mathematics, which has been embodied in at least one of hardware, firmware, or software has arisen in an effort to overcome the errors introduced in the transmission of data, so that the received data as corrected by an error correcting code (ECC) does not differ from the transmitted data, at least with a certain probability. Such codes are characterized by a code rate, being the ratio of its information content to the overall size of the codeword. For example, for a codeword that contains k data bits and r redundancy bits, that rate is defined by $k/(k+r)$.

As first theoretically shown by Shannon, and applied and extended by others, a channel may be characterized by a maximum information rate that may be related to the energy-to-noise ratio of the received signal. Practical error correcting code types do not achieve the theoretical performance predicted by Shannon; however, recent work with low density parity codes (LDPC) shows substantial improvement over Bose-Chaudhuri-Hocquenghem (BCH) and similar cyclic codes. Yet the selection of a coding scheme for a channel is determined not only by the theoretical properties of the code, but of the complexity in computation time, instruction code space, memory or hardware needed to implement the selected coding method as well as the model of the channel itself. This remains true whether the operations are performed in, for example, a FPGA, DSP or a general purpose processor, although the detailed considerations may be somewhat different.

Data storage has been modeled by considering the storage medium to be the conceptual equivalent of the transmission channel, and coding schemes designed for communications channels have been adapted to provide error correcting capabilities for RAM memory, magnetic disk memories, CD ROMs and the like. The behavior of a storage medium may not be characterized as having the same noise statistics as a communications channel having, for example, additive white Gaussian noise (AWGN), and other channel models may be used in order to evaluate and select the appropriate error correcting code.

An evolving form of data memory is NAND FLASH, which is now being used in large-scale data memory systems. Apart from having substantially asymmetrical write and read times, FLASH memory may exhibit technology-related error characteristics, amongst which are wear out, read-disturb, write-disturb, data decay, and the like. Read-disturb and write disturb errors may be considered to be a form of data dependent error. Wear our and data decay are forms of data retention error, and the effect of data decay, generally, is to increase the rate at which the voltage values representing the stored data decay with time. At present, although there is some published data and theoretical work on the characteristics of such FLASH memories, the situation has not stabilized, as the manufacturing technology of the various vendors is still evolving. A variety of techniques are being developed to compensate for and mitigate these characteristics, however residual errors remain.

There are two generic types of NAND FLASH, single level cell (SLC) and multi-level cell (MLC), characterized as storing one bit, or more than one bit, per memory cell, respectively. Today, the MLC FLASH products are favored as they provide the storage at a lower unit cost than the SLC FLASH products, even though the number of erase operations before wear-out is considerably greater for SLC FLASH than for MLC FLASH. Herein, the term MLC may be used to refer to any data storage format having more than one bit per memory cell.

Many other characteristics of the MLC product are less satisfactory than that of a corresponding SLC product, such as read, write and erase performance times. Here, we address only the error characteristics. There is some indication that these disadvantages of MLC are increasing as the manufacturers strive for increases in device density and lower product cost.

Apart from initial manufacturing defects, which are screened by the manufacturer, and which may result in some blocks of a FLASH memory chip not being made available to the user, all of the blocks of memory of a new FLASH memory device exhibit a very low and consistent error rate. The error correction capability under these circumstances need not be very strong. As the FLASH block is programmed (written), erased, and read, over a period of time, errors begin to occur and, after some number of erase operations or storage time, the error rate begins to markedly increase. At some error rate, the device becomes unusable, as whatever error correcting codes are used have insufficient capability to correct, or even to detect, errors.

A higher level operating system may be operable to extend the life of the device by ensuring a reasonable distribution of use across all of the blocks (wear leveling), but when the error rate exceeds some threshold, error-free recovery of the data is not possible. Before such time, a system policy may be executed that declares the FLASH to be worn out, and may migrate the data to an operable FLASH device so that the worn out device may be replaced, or at least not used. The details of such a policy may vary, but the policy generally has at least some relationship to the observed error rate for recovered data.

In another aspect, the operating parameters of a particular FLASH device may be adjusted over a lifetime so as to mitigate the wear on the device, and some manufacturers of solid state disks (SSD) using FLASH have developed procedures to perform these adjustments, sometimes working in concert with the manufacturer of the FLASH devices. While extending the lifetime of a particular version of a FLASH device using vendor specific characteristics and controls may be useful, the manufacturing processes may change, particularly with respect to feature size, and such management of FLASH parameters may lead to inconsistent results.

SUMMARY

A method of storing digital data is disclosed, the method comprising the steps of: dividing a chunk of data into a plurality of segments; computing redundant data for each of the plurality of segments using a first code type; computing redundant data for the chunk of data using a second code type; computing redundant data for the redundant data of the chunk of data using a third code type and storing or transmitting the plurality of segments, the redundant data of each of the plurality of segments, and the redundant data for the redundant data of the chunk of data.

A method of correcting errors in digital data r data, includes the steps of: receiving a chunk of data, the chunk of data comprising a plurality of segments of data, each segment of data having associated redundant data, and redundant data for redundant data for the chunk of data, but not including the redundant data for the chunk of data; correcting the segments of data using the associated redundant data for each segment; and, determining if all errors in the chunk of data have been corrected. If all of the errors in the chunk of data have been corrected, the chunk of data, which is the desired correct data, is output. If all of the errors in the data have not been corrected, the further steps of computing an estimate of the redundant data for the chunk of received data using a same procedure as was used to previously compute the redundant data for the chunk of data when it was stored or transmitted; correcting the estimate of the redundant data using the redundant data for the redundant data of the chunk of data; using the procedure used to compute the redundant data of the chunk of data and the estimate of the redundant data to correct the chunk of data; and correcting the segments of data using the associated redundant data for each segment are performed. This process is repeated until there are no more errors in the data. The data is then output.

In another aspect, a memory system comprises a memory module having an interface and a memory circuit; a first data redundancy computation unit is configured to compute redundant data for each one of a plurality of data segments of a chunk of data; a second data redundancy computation unit is configured to compute redundant data for the chunk of data; and a third data redundancy computation unit is configured to compute redundant data for the redundant data of the chunk of data. The chunk of data, the redundant data for the data segments of the chunk of data and the redundant data for the redundant data of the chunk of data are stored in the memory circuit, and the redundant data for the chunk of data is not stored in the memory circuit.

In an aspect, the memory system retrieves and corrects errors in the retrieved data by processing the chunk of data, the redundant data for the data segments of the chunk of data, and the redundant data for the redundant data of the chunk of data that are read from the memory circuit, and corrects errors in the data read from the memory circuit using the redundant data for the data segments and the redundant data for the redundant data of the chunk of data.

In yet another aspect, a computer program product is stored on a non-volatile computer readable medium, and includes instructions to be executed by a processor for: dividing a chunk of data into a plurality of segments; computing redundant data for each of the plurality of segments using a first procedure; computing redundant data for the chunk of data using a second procedure; computing redundant data for the redundant data of the chunk of data using a third procedure and storing or transmitting the plurality of segments, the redundant data of each of the plurality of segments, and the redundant data for the redundant data of the chunk of data.

In still another aspect, a computer program product is stored on a non-volatile computer readable medium, and includes instructions to be executed by a processor for: receiving a chunk of data, the chunk of data comprising a plurality of segments of data, each segment of data having associated redundant data, and redundant data for redundant data for the chunk of data, but not including the redundant data for the chunk of data; correcting the segments of data using the associated redundant data for each segment; and, determining if all errors in the chunk of data have been corrected. If all of the errors in the chunk of data have been corrected, the data of the chunk of data is output.

If not all of the errors in the chunk of data have been corrected, the following additional steps are performed: computing an estimate of the redundant data for the chunk of received data using a same algorithm as was used to previously compute the redundant data for the chunk of data; correcting the estimate of the redundant data using the redundant data for the redundant data of the chunk of data; using the algorithm used to compute the redundant data of the chunk of data and the estimate of the redundant data to correct the chunk of data; correcting the segments of data using the associated redundant data for each segment; and, repeating until no errors remain in the segments of data.

The term "procedure", as used herein when referring to an error correcting code, means a mathematical operation on a plurality of bits of data that produces redundant data for the purpose of correcting later-arising errors in the data, and the use of such data to correct such errors in the data. The procedure may be different for each code type and may depend on the extent of the data being protected by the code.

DESCRIPTION

Exemplary embodiments may be better understood with reference to the drawings, but these embodiments are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

When describing a particular example, the example may include a particular feature, structure, or characteristic, but every example may not necessarily include the particular feature, structure or characteristic. This should not be taken as a suggestion or implication that the features, structure or characteristics of two or more examples, or aspects of the examples, should not or could not be combined, except when such a combination is explicitly excluded. When a particular aspect, feature, structure, or characteristic is described in connection with an example, a person skilled in the art may give effect to such feature, structure or characteristic in connection with other examples, whether or not explicitly set forth herein.

A memory system may be comprised of a number of functional elements, and terminology may be introduced here so as to assist the reader in better understanding the concepts disclosed herein. However, the use of a specific name with respect to an aspect of the system is not intended to express a limitation on the functions to be performed by that named aspect of the system. Except as specifically mentioned herein, the allocation of the functions to specific hardware or software aspects of the system is intended for convenience in discussion, as a person of skill in the art will appreciate that the actual physical aspects and computational aspects of a system may be arranged in a variety of equivalent ways. In particular, as the progress in the electronic technologies that may be useable for such a system evolves, the sizes of individual components may decrease to the extent that more functions are performed in a particular hardware element of a system, or that the scale size of the system may be increased so as to encompass a plurality of system modules, so as to take advantage of the scalability of the system concept. All of these evolutions are intended to be encompassed by the recitations in the claims.

Herein, a variety of error-correcting codes are described. This is a broad field and there is no intent to limit the type of error correcting code or codes which may be used to practice the techniques described herein. Broadly, error correcting codes are a form of redundant data computed from the data and used to correct errors in the data which arise in the storage or transmission thereof.

NAND FLASH memory may be physically organized as a plurality of blocks on a die, and a plurality of dies may be incorporated into a package, which may be termed a FLASH chip. A data block is comprised of a plurality of pages, and the pages are comprised of a plurality of sectors. Some of this terminology is a legacy from hard disk drive (HDD) technology; however, as used in FLASH memory devices, some adaptation is made. NAND FLASH memory is characterized in that data may be written to a sector of memory, or to a contiguous group of sectors comprising a page. Pages can be written in order within a block, but if page is omitted, the present technology does not permit writing to the omitted page until the entire block has been erased. A block is the smallest extent of memory that can be erased, and an entire block needs to be erased prior to being again written (programmed) with different data. That is, it may be possible to refresh the data stored in a memory cell, but the logical value of the data stored remains unchanged.

Earlier versions of NAND FLASH had the capability of writing sequentially to sectors of a page, and data may be written on a sector basis where the die architecture permits this to be done. More recently, die manufacturers are evolving the device architecture so that one or more pages of data may be written in a single write operation. This includes implementations where the die has two planes and the planes may be written simultaneously. All of this is by way of saying that the specific constraints on reading or writing data may be device dependent, but the overall approach disclosed herein may be easily adapted by a person of skill in the art so as to accommodate specific device features.

One often describes stored user data by the terms sector, page, and block, but there is additional housekeeping data that is also stored and which must be accommodated in the overall memory system design. Auxiliary data such as metadata, error correcting codes and the like that are related in some way to stored used data is often said to be stored in a "spare" area. However, in general, a block of data may be somewhat arbitrarily divided into physical memory extents that may be used for data, or for auxiliary data. So there is some flexibility in the amount of memory that is used for data and for auxiliary data in a block of data, and this is managed by some form of operating system abstraction, usually in one or more controllers associated with a memory chip, or with a module that includes the memory chip. However, as user data is often partitioned into 512 byte (B) logical units, this is a common allocation for a sector of user data. The auxiliary data is stored in a spare area which may be allocated from the available memory area on a sector, a page, a block or other basis. Generally, a design seeks to maximize the memory resources that may be used for storage of user data. So, the auxiliary data, including any error correcting codes, are desired to be kept to a minimum consistent with system performance requirements.

In this context, the evolution of MLC FLASH technology is generally not supportive of minimizing auxiliary data, as the number of error bits in a page of stored data appears to be increasing in more recent designs. This may require more robust error correcting codes, which may result in increased space needed for the auxiliary data.

The management of reading, writing of data, and the background operations such as wear leveling and garbage collection is performed by a system controller, using an abstraction termed a flash translation layer (FTL) that maps logical addresses to the physical addresses of the memory. The details of FTLs are known to a person of skill in the art and are not further described herein. The use of a FTL or equivalent is assumed, and this discussion takes the view that the abstraction of the FTL is equivalent of directly mapping a page of user data to a specific set of physical memory locations.

In contrast with a communications channel, for example, the error characteristics of a block of FLASH memory may vary with position within a block, as the block is formed of sectors and pages which may have different physical locations, manufacturing tolerances and intrinsic defects. Most communication channel code types presume that the errors are randomly distributed in time, that the channel is memoryless and that the raw bit error rate (BER) is dependent only on the average bit-to-noise power ratio (signal-to-noise ratio, SNR). In some channel models, bursts of errors are also modeled; the occurrence of such bust errors is usually also considered to have statistical properties.

The problem with most system models is that they do not assume that the error distributional models have a "fat tail", as this would require a log normal or other mathematical model that is analytically incompatible with general closed-form solutions. In such cases, a numerical simulation approach is used. But, when an uncorrected bit error rate (UBER) of better than $10^{-18}$ is required, the number of simulations required to evaluate a code may become impractical, particularly when a number of coding schemes or combinations thereof are to be evaluated.

Consider a portion of a block of FLASH memory, comprising a plurality pages, $p_1, p_2, \ldots p_{16}$, each having four sectors s. In this example, each sector s is comprised of 512 bytes of data and a spare area that is used to store associated data. The associated data may, for example, include an error correcting code (ECC) for the sector, metadata for the data, and possibly at least a portion of other ECC data. Alternative arrangements of the data within a page or block of pages are possible, depending on the manufacturer and the FTL and other design considerations. But, ultimately, the number of bits allocated to the error correction process is limited either by the amount of spare area provided by the device manufacturer or the total amount of the memory that can economically be devoted to the ECC data.

Where an inner error correction code $ECC_{inner}$ and an outer error correction code $ECC_{outer}$ are used, the $ECC_{inner}$ is usually computed over at least the user data and the $ECC_{outer}$ is usually computed over at least the user data, the $ECC_{inner}$ and some or all of the metadata.

An $ECC_{inner}$ for the data of the sector may be a BCH code ($BCH_s$), Reed Solomon (RS), parity or other known code scheme. The subscript "s" is intended to denote a code associated with a sector, and "p" to denote a code associated with a page, for example. Such codes are well known and are a form of redundant data that is capable of correcting errors. A typical BCH code may correct errors in T bits of sector s data and detect up to 2T bits of error. The actual number of sectors encompassed by an encoding scheme is not intended to limited to a conventional page, which is typically four sectors. Rather, any multiple number of "sectors" may be used. So, one may consider that the process is applied to a "chunk" of data of a size appropriate to the particular design, and that a plurality of chunks is included within an outer code.

Inevitably, confusion can arise when terms of art of two related technical fields having differing evolutionary paths are combined, in that the same term may have a somewhat different meaning in each field. Here, we are using the term sector as the extent of the data covered by a particular code, but in other contexts the extent of the data being covered by the code is called a block of data. A person of skill in the art would understand the meaning of each usage.

When the number of errors in the recovered data (the data read from memory) exceeds T, the errors may not be corrected by the BCH code, and when the number of errors exceeds 2T, there is some probability that result of applying the BCH code will neither correct nor detect the errors. Detected, but uncorrected, errors may sometimes be corrected by re-reading the data from the memory or soft threshold detection. So, a policy for the operation of a FLASH system may be that a page of data will not be used again if the number of detected errors for a sector exceeds T by some value, so that the number of errors does not exceed 2T the next time the data is read or the next time the page is erased and written, or when a specific number of retries is unsuccessful. The actual policy may be more complex and deal with write errors, erase failures, and the like, as criteria, and may include specific manufacturer recommendations.

In a practical communications system, however, discarding of bad sectors, pages or blocks which may exhibit locally high error rates may not be feasible as communications channel characteristics have no memory and a noise burst producing such an error is not repeatable. Some communication channels may, however, provide for acknowledgement of correct reception and for requesting repeats of corrupted data.

However, as we have noted that the FLASH memory error rate depends on the number of erase operations performed on the block, the error rate increases in a relatively predictable and generally monotonic fashion, and a page exhibiting an excessive error rate will tend to do so repeatedly as the device wears. So, the practical question is: How close to the maximum error rate can the device be operated, while guaranteeing the required overall uncorrected bit error rate (UBER)? A reason that manufacturers of storage systems may wish to operate close to the wear-out point is that the longer the memory module having the memory circuit can operate in terms of erase operations or storage time, the longer the lifetime of the module, and the lower the promised life cycle cost of operation.

On a page or multi-page basis, the data may be further protected by a cyclic redundancy code (CRC) computed over the data that is to be stored, so that then the data is retrieved, an excessive number of errors that precludes correction or detection of errors will not result in the return of incorrect data. Although failing the CRC would mean that the data would need to be reconstructed using other redundant data such a RAID, retrieval from a backup, or the like, this at least prevents returning incorrect data.

An $ECC_{outer}$ may be employed at the page or multipage level to further improve the error performance of the memory system. For example, another BCH code may be computed for a page or a group of pages of data ($BCH_p$). Taking a page as a specific example, assume that, when the previously written data has now been read, and the BCH, for each sector has been applied to the data of that sector, that one of the sectors has more than T errors, but less than 2T errors. The data for this sector cannot be corrected. But the data for the remaining three sectors each may have less than T errors per sector and may therefore be corrected. The $BCH_p$ may be computed over a data length that is a multiple of a sector length (such as a page), and may be designed so as to correct more than the number of errors that can be corrected by each $BCH_s$. Consider a situation where, after applying the corresponding BCH, to the data of each of the sectors, three of the sectors of a page have had any error corrected, but the fourth sector has not. However, the sector may be presumed to have between T and 2T errors. If the $BCH_p$ has sufficient capability to correct up to, for example, 2T errors in the page, then the remaining errors may be corrected by the $BCH_p$ and the entire page of data may be recovered.

This approach recovers the data, but depends on the $BCH_p$ to have sufficient error correction capability. The error correction capability of a code depends, in a somewhat complex manner, on the number of bits in the code. Since the code data needs to be appended to the data being protected by the code to form the code word, and stored in the FLASH, the larger the code word, the larger amount of storage space that is needed. This is the equivalent of transmitting more code bits (redundancy data) in the code word, so that the code rate is reduced. The inefficiency in storage may compromise the economic viability of the system; thus an excessively long code word may be undesirable. Furthermore, such decoding long codes word may be computationally complex and may be both time consuming to execute and be resource burdens to the system.

Note than in the approach described above, the corrected data of the other correct or correctable sectors was not used in an attempt to correct the sector having uncorrectable data. Apart from reducing the overall error rate of a sector, corrected data of a sector, and thus the page, the data within each sector was treated separately. There was, however, a benefit of correcting the data of the other sectors where such correction was possible, as the total number of bits in error at the page or multipage level had been reduced by the prior correction of the sector data.

In the system and method described herein, a recoverable code (RCC) may be constructed over, for example, the entire page and may be computed by computing a parity bit representing one or more bits from each of several sectors to form a check bit. In an approach used for computing low density parity codes (LDPC), for example, three bits, each bit from a different sector may be added modulo 2, and a $4^{th}$ bit, a check bit, determined so that the parity is, for example, odd. In the LDPC example the check bits comprise the redundant data, and these check bits are appended to the data word before transmission or storage so as to comprise a LDPC codeword. In the case of storage of data to FLASH memory using a LDPC code, the data bits and the check bits are stored as the codeword. The computation of the check bits may, for example, use any technique that is compatible with computing the check bits of a LDPC code.

Since many LDPC codes have a code rate of about 0.5, the amount of redundancy data is about equal to the user data being stored. That is, the data storage capacity would need to be twice that of the user data. Such a large amount of data storage may compromise the economic viability of the storage system. Other examples of LDPC codes may have code rates of about 0.9.

LDPC codes are, however, amongst the better performing coding schemes, as an interactive decoding scheme is used where incremental corrections are made to the data by resolving conflicts between the stored redundancy data (the check bits) and data dependent check bits computed from the user data that is currently being read. The iterative process of applying the LDPC may be continued until all of the errors have been corrected, the number of iterations reaches a preset threshold, or a stopping set is found. The stopping set indicates that all of the errors may not be correctable. While the performance of a particular LDPC coding scheme is not theoretically computable, simulations and practical experience indicate that a LDPC code substantially outperforms BCH codes of the same code rate.

There two generic methods of resolving ambiguities in determining which bit of the plurality of bits contributing to a check bit is actually in error: hard decision and soft decision. The latter is a probabilistic weighting of the bits based on other criteria, such as a probability that the bit is in error. Both approaches may be used in conjunction with the method and system disclosed herein, however the discussion will focus on hard decisions as the concept is somewhat easier to explain.

Even if all of the errors in a page of data have not been corrected by a page level LDPC code as applied to data which may have previously been corrected, at least for some sectors at the sector level, those errors that have now been corrected by the LDPC code may reduce the number of remaining errors in that sector that had previously uncorrectable, so that the remaining number of errors is less than or equal to $T_s$, and the remaining errors may be corrected by reapplying the $BCH_3$.

As mentioned above, the relatively low code rate of typical LDPC codes requires the dedication of significant amounts of memory for storage of the redundancy data added by the LDPC generation procedure so as to form the codeword. Rather than storing the check bit redundancy data of the LDPC code, we compute a $BCH_c$ (or other code) over the check bits of the LDPC and store the $BCH_c$ as a representation of the check bits. So, instead of storing all of the check bits of the LDPC, a smaller number of bits associated with the $BCH_c$ is stored instead. If the storage space permits, some of the check bits may also be stored so as to speed up some of the computations.

The representation of the LDPC check bits by another error correction code appears possible as none of the practical error correction codes in use today approach the Shannon limit, so that additional coding may result in improved efficiency in the memory or communications channel.

The length of the RCC data may be segmented into a plurality of smaller extents, each segment being protected by an associated BCH, code word. The operation of the error correction properties of this arrangement are described by continuing the example where the overall length of data to be protected is 32K, and that sectors of the data of a size 512 are each protected by a $BCH_s$ code word ($BCH_{s1}, \ldots, BCH_{s64}$). The LDPC check bits (RCC) are not stored. They are represented by the ECC computed over the RCC.

An estimate of the discarded (that is, not stored or transmitted) LDPC redundancy data (RCC) may be computed by again applying the LDPC generation procedure to the retrieved or received data (which may include the $BCH_s$ data) that has been read from the memory or received over the communications channel. That is, when the data is read from the memory, the RCC code is again computed as if the data being read or received is correct. (Before again computing the RCC, the data of each sector may be corrected by the associated $BCH_s$. If errors are corrected using the $BCH_s$ then the estimated RCC computed from the retrieved data will have fewer errors. Where the BER is low, this may be sufficient to correct all of the errors.) If there are no errors, the estimated RCC computed from the data being read from the memory should have the same value as the RCC computed from the data when the data was written to the memory. For the moment, we may consider that the RCC computed from the data read from memory is an estimate of the RCC of the stored data (eRCC). The recoverable code, RCC, may have been computed, for example. using bits selected from a group of three sectors using a trellis code, or other encoding approach, such as may be used in the LDPC coding scheme being used, where each of the data bits in a sector is combined with data bits from two other sectors, or by another appropriate code type. In this situation, a single bit that is in error after processing with the $BCH_s$ may result in a plurality of errors in the recovered version of the RCC (eRCC). (The case of multiple sectors having remaining bit errors can be handled also, but is not discussed here so as to simplify the discussion.)

That is, there may be uncorrected data errors in the data that has been read from memory, even after applying the $BCH_s$ to the sectors, and the redundancy data (eRCC) computed by the LDPC code may also have errors since some incorrect data was used in the process of computation of the redundancy data from the data read from memory.

It is in this sense that the later-computed LDPC check (redundancy) bits (eRCC) are only an estimate of the original LDPC check bits (RCC) computed before the data was stored in FLASH memory. The discarded redundancy data of the LDPC, is the recoverable correction code (RCC) and the error correction process is intended to bring the estimated RCC, eRCC, into conformance with the original RCC (which was not stored), at which point all of the data errors have been corrected.

In an example, a group of pages of data is stored, with the associated BCH, for each sector of a page of the group of pages. An code such as the LDPC may be used to compute the check (redundancy) bits as if a LDPC code word were to be stored. The resultant LDPC redundancy bits are the RCC and for a 0.5 rate LDPC code the RCC has the same number of bits as the data to be stored in the sectors of a page. The computed RCC may be divided into a number of data extents and a BCH, ($ECC_{outer}$) computed over each extent of the RCC. However, only the data of each sector, the $BCH_s$ for each sector and the BCH, (or other type of code) for each RCC extent are stored. The check bits themselves (the original and correct RCC) were discarded. (In a data transmission system, they would not be transmitted.) In the present example, the number of RCC bits discarded was equal to the number of data bits to be stored. The RCC bits are replaced by the $BCH_c$.

When the group of pages or a portion thereof is read, the sector data, the $BCH_s$ ($ECC_{inner}$ and the $BCH_c$ ($ECC_{outer}$) are read. Let us assume that, in a first instance of this example, the number of errors in each sector is less than $T_s$. So, any errors in a sector may be corrected by the associated $BCH_s$, and the result is that an estimated user data set having no errors is produced. Now an estimated RCC may be computed from the corrected sector data. Since the underlying data is correct, then the estimated RCC that has been computed from the data read from the sector as corrected by the $BCH_s$, is correct. This can now be verified by applying the corresponding $BCH_c$ that was stored with the data associated with the corresponding extent of the estimated RCC. Since the estimated RCC is correct, there were no errors in the estimated RCC for the $BCH_c$ to correct. (Since all of the sector data was corrected, the eRCC was correct and need not actually have been computed and verified, but the steps are is performed here so as to show the method if it were to be applied when there is a sector with uncorrected bit errors.). This example illustrates that, depending on the number and distribution of errors in the data read from the FLASH memory, some of the steps in the method may be omitted. That is, the steps of the method need only be performed until it has been determined that all of the errors have been corrected.

In a case where the number of errors in one or more sectors exceeds $T_s$, there will be uncorrected errors in that sector. When the RCC is reconstructed from data having errors, the estimated RCC that is computed will have errors. When the $BCH_c$ is applied to the RCC, the $BCH_c$ will be able to correct the errors if the number is less than $T_c$ in an estimated RCC extent, and at least to detect that there are errors if there are less than $2T_c$ errors. Such detected, but uncorrected errors may be evaluated using an erasure code.

In this example, each actual errored bit produces three errors in the recovered (estimated) RCC. However, the errored bits of a user data sector of the eRCC are distributed over the multiple data extents of the recovered RCC. The number of errored bits in one or more of the extents of the recovered RCC may less than $T_c$ for the BCH, selected, and the errors in the one or more data extents of the eRCC can be corrected.

After processing some or all of the recovered (estimated) RCC code extents using the associated $BCH_c$, some portion of the errors in the overall recovered RCC code word have been corrected, and there corrections may now be applied to the underlying user data. For each of the RCC bits, in this example, there were three contributing user data bits. From the previous application of the $BCH_s$ to the data, in this example, we had determined that two of the user data bits were in sectors the where number of errors in the read data were less than $T_c$, and any such errors were corrected by the $BCH_s$. That is, they are known good bits. However, the resultant eRCC code word bit was determined to be in error by application of the $BCH_c$. So, correcting the underlying data bit of the user data that was not known to be correct (the one in the sector where the BCH, code was inadequate to correct all of the errors) would be the corrective action that needs to be taken so that the associated estimated RCC data extent has no errors. Thus the estimated RCC of the entire data set has been updated by correcting one or more of the estimated RCC data extents.

This process has produced a new estimate of the user data that was originally stored, where some of the errors that were uncorrectable by the first application of the $BCH_s$ have been now been corrected. If the remaining number of errors in a sector is less than $T_s$, then the sector bits in error may be corrected by again performing the decoding operation using the $BCH_s$ for that sector. However, if the number of errors has not yet been reduced to this value, the estimated user data set is again processed to form a new estimate of the recovered RCC. This new second estimate of the eRCC will have fewer errors than the initial estimate of the RCC redundancy data, since each of the errors that were corrected in the user data reduced the number of errors in the recovered RCC by a factor of about 3.

The new estimate of the recovered RCC again processed extent-by-extent using the $BCH_c$, and errors now correctable in the new estimate of the eRCC are corrected. The process continues until all of the user data is validated by the associated $BCH_s$, or the process is terminated for other reasons. When each of the sectors of data has been processed by the associated $BCH_s$ so that all of the errors in the sector data have been corrected, the underlying data has been recovered and is all correct. That is, the data that was originally read, and formed the first estimate of the correct data has now become equal to the correct data. The eRCC is also now the same as the original RCC that was not stored.

The outlier case that the error distribution was so perverse that one of the sectors still had more than $2T_s$ errors, and the errors remained undetected, may be protected against by a CRC or other error detection code computed over the 32K of user data.

The type of error termed "write disturb" error is manifest, for example, when a written sector is read immediately after writing and exhibits errors. Such errors may be due to a number of root causes. If the block containing the sector were to be erased and the same data written, the errors may be substantially the same. This situation may be observed by immediately reading a written sector and comparing the results with the original version of the data that is still in non-volatile memory. The errored bits are therefore known even at this stage, as is their location.

Rather than computing the $BCH_s$ over the original data, the $BCH_s$ may be computed over the data just read, which contains known data errors. These known errors may be separately stored as an adjunct to the $BCH_s$. Since the data exhibiting the write-disturb error is presumed to be correct when computing the $BHC_s$, the number of errors that can be corrected by the $BCH_s$, remains at $T_s$, where the errors that are correctable are errors arising since the computation of the $BCH_s$. The earlier errors are known, and are considered as being correct by this later computed $BCH_s$ and will be corrected after application of the $BCH_s$ to the stored data. In this aspect, the method involved in checking the read-back data against a known error-free version of the user data temporarily stored in volatile memory and immediately determining the errors in the already stored data. Only later arising errors in the stored data need to be corrected by the now-computed $BCH_s$ as the previous errors are already determined and stored. This property may be most useful when the FLASH memory is nearing the number of erase operations that results wear out for the particular device, and there exist a growing number of errors that arise during the write operation. Later arising errors may result from aspects of data retention, which also degrade near the wear out point. So, the effects of write disturb and data retention may be somewhat decoupled from each other. As each individual device reaches the wear out point for a block or group of blocks at a different time, and that time is dependent on a variety of parameters, not all of the blocks of a die will encounter this situation simultaneously.

The extent of the error-correcting process that needs to be applied in any specific read operation may therefore differ between the individual read operations depending on the wear state of the locations being read. The wear state and error characteristics of each block of FLASH memory generally follow the same wear out trend, however the individual blocks may have either differing number of accumulated erase operations, or other aspects the affect the error rate of the stored data and this may vary with the page location of in the block.

The error-correction process may be performed by a common hardware element configured to perform the needed computations for each of the $ECC_{outer}$, $ECC_{inner}$, and RCC generation procedure, where the number of iterations of each procedure is a function of the error characteristics of the data being read. Alternatively dedicated system elements may be used for one or more of the computations.

While the processing workload increases near wear out due to an increasing number of iterations of the procedures, there is unlikely to be a sharp increase in processing workload, as blocks would be declared "worn out" and retired in an relatively orderly manner due to the variability in the memory block wear conditions. In an alternative, aspects of the error correction method that are expected to be performed infrequently may be performed by other hardware or processing resources of the memory or communications system so as to result a reduction of complexity.

Consider a situation where the $ECC_{inner}$ has a correction capability of $T_s$ and a detection capability of $2T_s$, and the $ECC_{outer}$ has a correction capability of $T_c$ and a detection capability of $2T_c$ and where the values of $T_s$ and $T_c$ are equal. Such a situation may arise if it is desired to use the same BCH engine for the inner and outer ECC codes. The RCC encoder procedure may be selected, for example, from a set of regular combinatorial trellis codes such that not more than M<=2T bits from a sector are mapped to same three RCC check bit extents.

After some number of iterations of the error detection and correction procedure, as has already been described, some pathological pattern of bit errors may prevent the correction of one of the sectors of user data. In the pathological case being described all of the E errored bits, E>T, E<=M, belong to a set of M bits which all map to the same three RCC extents. Each of three RCC extents of the total number of RCC extents will then have greater than T bits in error and also be uncorrectable. These bits map back to the sector of stored data having the uncorrectable errors. The properties of the BCH code are such that when the number of errors are greater than T, but less than 2T, the errors are detected, but not corrected. However, as a result of following the mapping of the RCC encoder back to the sector, the location of the M bits that could be in error can be determined. However, one does not know which of the M identified bits are in error. The number of errored bits is bounded as T<E<=M<=2T. So in this case more than half of the M bits that map to these same three RCC extents are in error.

Since E>T and M<=2T, we have that M-E<T where M-E is the number of correct bits in the group of M. So if all M bits of the group in the sector that are identified as having the possibility of being in error are flipped then all the errored bits become correct and all the correct bits become errored. While this may transform a currently valid bit into an error bit, the step started with more than half of the identified bits being in error. By flipping all of the bits simultaneously the group of bits that have been flipped now has less than T data bits in error. At this juncture, processing the sector data with $ECC_{inner}$ will correct the remaining bit errors, completing the process.

Irregular combinational trellis codes may also be used and these codes may be compatible with using soft decision concepts to correct the errors.

Figure 2:
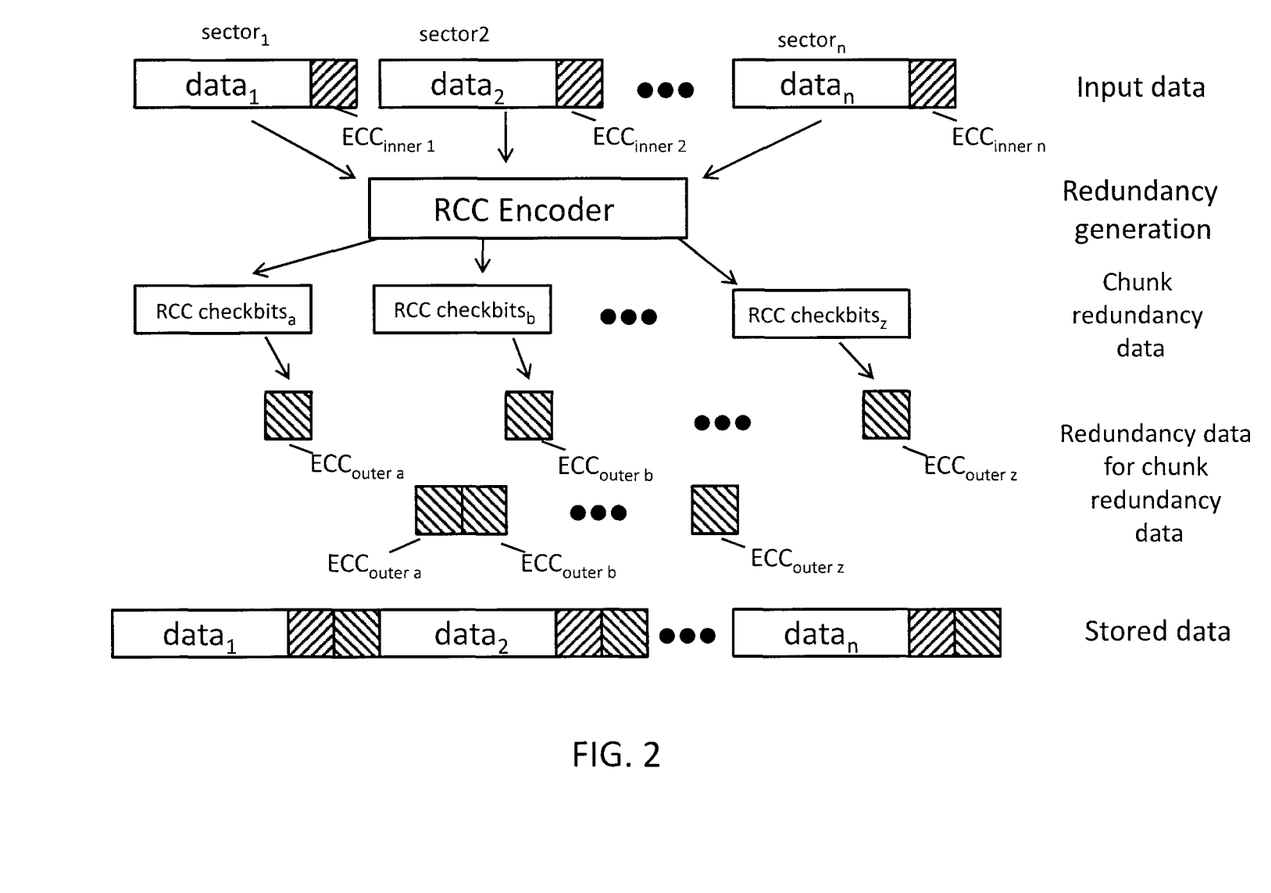
FIG. 2 is a schematic flow diagram illustrating the process of encoding data using the error correcting method of an example; and, FIG. 3 is a schematic flow diagram illustrating a single iteration of the process of decoding data using the error correcting method of an example.
Figure 3:
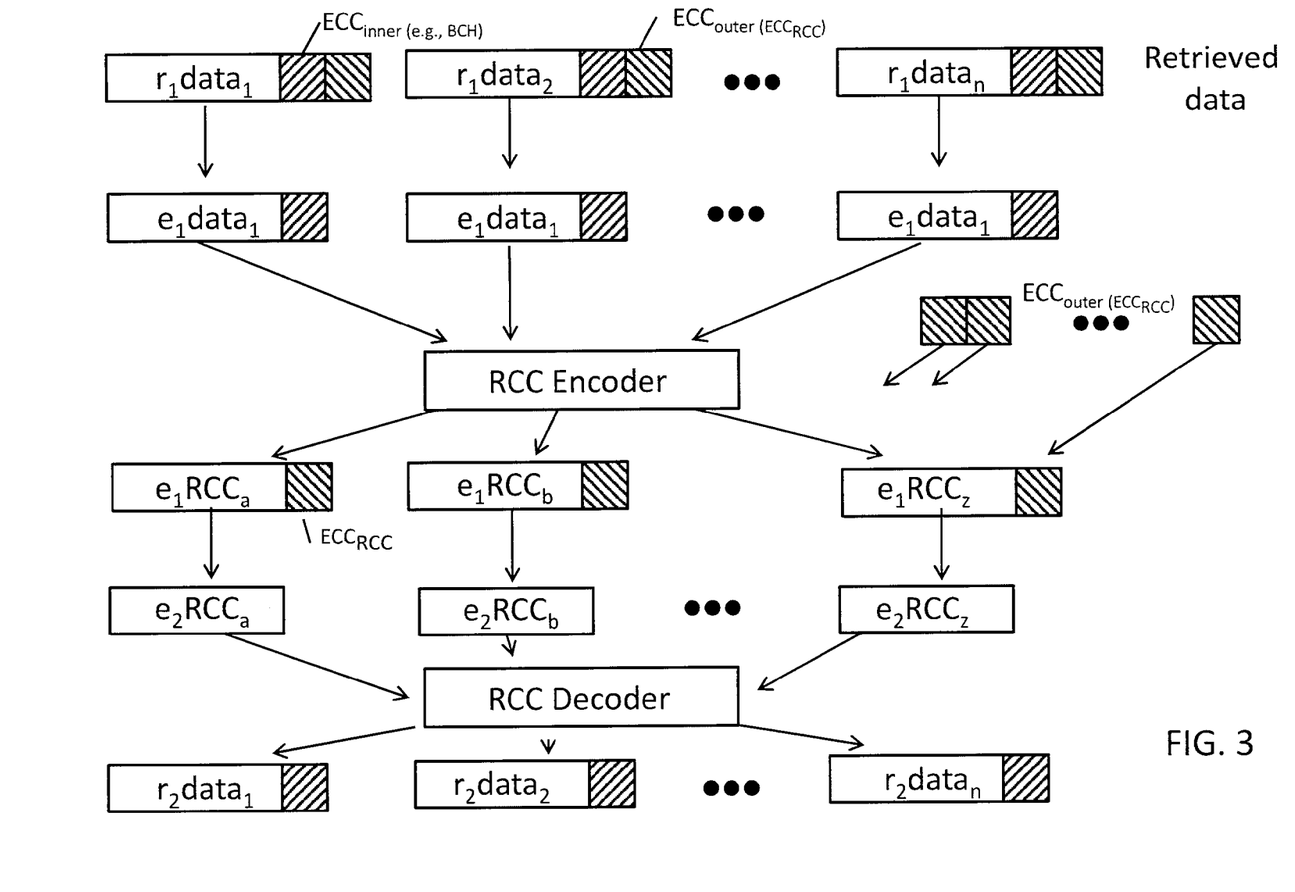

An example of the method may be therefore be summarized as the following steps, as shown in FIGS. 2 and 3:

For a first extent of data, which may be one or more pages in a memory, each page having sectors:
  dividing the first extent of data into a plurality of second extents of data and compute a BCH, over each of the data extents (the second extents may be a sector, for example);
  computing a RCC over the first extent of data;
  dividing the RCC into a plurality of RCC extents;
  computing a $BCH_c$ over each of the RCC extents;
  storing the data, the $BCH_s$ and the $BCH_c$, but discarding the RCC;
  recovering the data extent by reading the data, the $BCH_s$ and the $BCH_c$ from the memory and:
  processing each of the second extents of data using the associated $BCH_s$ and correcting the errors in those extents where the number of errors is less than $T_s$, and detecting the errors in those extents where the number of errors is between $T_s$ and $2T_s$, so as to form a first estimate of the user data;
  computing a recovered RCC (eRCC), using the first estimate of the user data;
  applying the corresponding $BCH_c$ to each of the recovered RCC extents so that, for each RCC extent having less than $T_c$ errors, the errors are corrected, this forming a first estimate of the original RCC. Using the first estimate of the original RCC to correct at least some of the underlying errors in the first estimate of the user data, so as to form a second estimate of the user data;
  for each second extent having uncorrected errors in the first estimate of the user data, process the second estimate of the data using the associated BCH, and correct the errors if possible. (Correction would be possible if the act of forming the second estimate of the data had reduced the number of errors in the sector to less than $T_s$. This corrected data may be considered as a third estimate of the data);
  computing a second estimate of the eRCC using the third estimate of the data;
  applying the BCH, for each extent of the RCC to the second estimate of the RCC and correct errors in extents of the eRCC where the number of errors is less than $T_c$;
  continuing to apply the updated estimates of the eRCC to the underlying data, and to correct the underlying data using the associated $BCH_s$, and,
  repeating the process until all of the errors in the first extent of data have been corrected, or a predetermined event, or number of iterations of the process occurs.

The computation of the RCC and the estimated RCC and the use of the estimated RCC to correct the underlying data may be based, for example, on the LDPC code. The correction of the estimated RCC and the data segments read from the memory may be based on the BCH code. These are examples that are used to illustrate the technique and are not intended to be limiting.

The system and method may be embodied in hardware, software running on a general purpose processor, or a combination of such elements, as is known the art. The hardware may include, but not be limited to field programmable gate arrays (FPGA), application specific integrated circuits (ASIC), hard wired logic, digital signal processors, and microprocessors executing a stored program.

Figure 1:
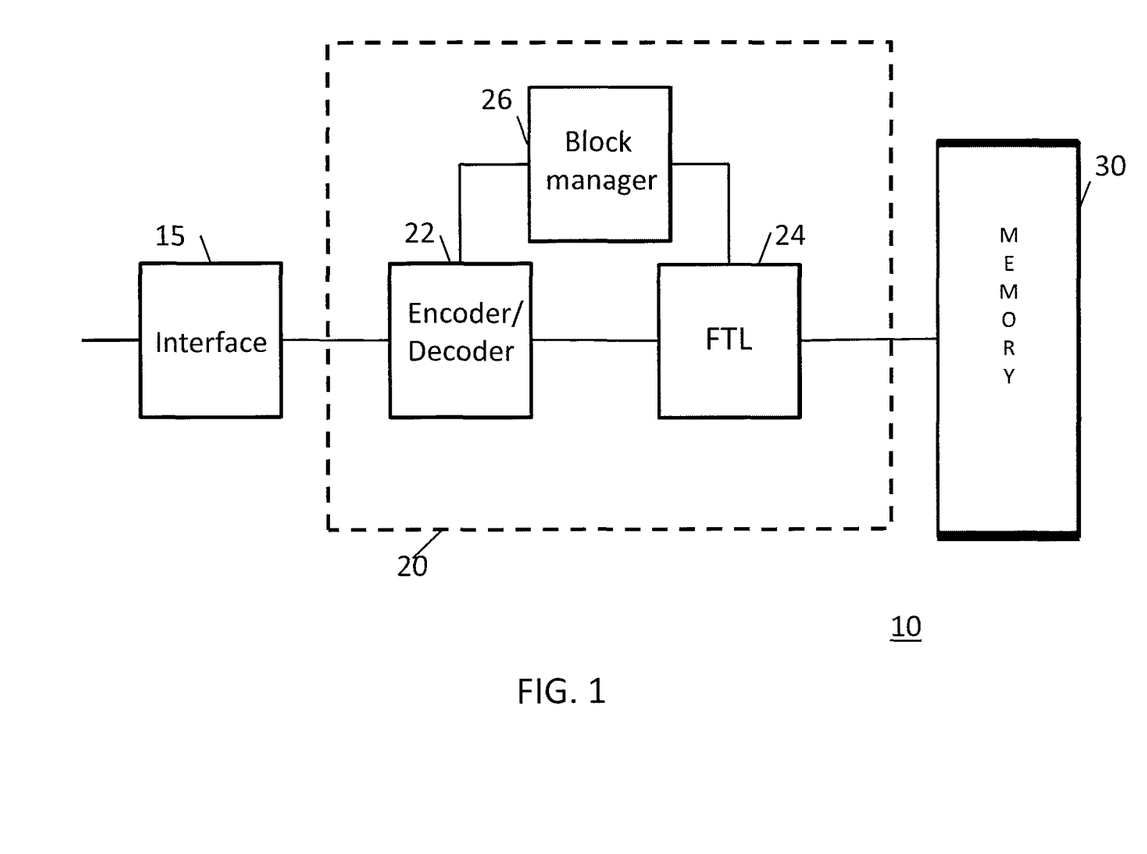
FIG. 1 is a block diagram of a storage module using the error correcting method of an example.

An example, shown in FIG. 1, is a memory module 10, which may be part of a larger memory system, or a replaceable unit such as a solid state disk (non-volatile memory, SSD) or the like. The memory 30 may be, for example one or more NAND FLASH circuits, however other memory systems may benefit from the concepts disclosed herein, and are not intended to be excluded. A memory module 10 may be considered to represent a memory system of varying degrees of capacity or complexity, or a transmitting or receiving interface of a communications system, where the element 30 represents the external communications interface. An interface 15 is disposed between source of data outside of the memory module (not shown) and the module controller 20. The characteristics of the interface 15 are selected to be electrically and protocol compatible with the outside source of data, which may be a network connection, or, for example, attachment to a computer using SCSI, PCIe, or other interface selected by the user of the memory module 10. The interface module 15 may have a proprietary external interface or other interface compatible with use in a larger scale memory system, computing system or communications system (not shown) and may be any one of a number of industry-standardized interfaces.

The controller 20 is disposed between the interface 15 and the memory 30, and in addition to the functions shown in FIG. 1, may perform further protocol conversions and other housekeeping operations to facilitate the operation of the memory module 10. The controller may perform the acts of encoding and decoding 22 the data to be stored on the memory 30, and present logical extents of data that have been augmented with error detecting and error correcting codes as previously described. Each logical extent of data is mapped to a physical memory extent by the FTL 24. The FTL may also perform such housekeeping operations garbage collection and wear leveling. A pool of blocks of the memory that are available for storage of data is managed in a coordinated manner by the FTL 24 and a block manager 26, in communication with the encoder/decoder 22. In addition to measures of block wear and error rate which may be obtained and used by the FTL 24, the block manager 26 may monitor the performance of the decoder function of the encoder/decoder 22 so that pages or blocks of the FLASH memory that begin to exhibit undesirable error statistics properties may be removed from the available pool of memory locations in memory 30 in accordance with a policy.

FIGS. 2 and 3 illustrate an example of the process preparing for storing data in the memory 30 and the correcting of errors in the data that is read from the memory 30, respectively. This particular example is simplified and omits optional enhancements, as well as limiting the sequence of steps to one iteration of the overall error correction method, whereas multiple iterations of all or part of the error corrections steps may be needed, as has previously been described.

FIG. 2 shows a plurality of data: $data_1$, $data_2$, ... data n, which may be, for example, sectors of a multi-page data set to be stored in memory 30. An inner error correcting code $ECC_{inner1}$, $ECC_{inner2}$ ... $ECC_{inner\,n}$, which may be a BCH or other error correcting code, is computed over each of the sectors ($data_1$, etc.) and associated with a sector of data. An RCC encoder, which may be a form of LDPC redundancy code generator, which may be a trellis code, or the like, computes redundancy data (RCC) in the form of, for example, check bits, as previously described. An $ECC_{outer}$, which may be another BCH code may be computed. The error correction capabilities of the $ECC_{outer}$ may be greater than, less than or equal to that of the $ECC_{inner}$, depending on the detailed design, and the $ECC_{outer}$ may be a different type of code such as a RS, parity or other code.

Each computed $ECC_{outer}$ is associated with a computed RCC check bit extent over which it has been computed, and the $ECC_{outer}$ codes that have been computed may be stored or transmitted. The computed RCC check bits themselves are only an intermediary step in obtaining the $ECC_{outer}$ codes which are acting as a proxy for the RCC over which they have been computed. The information that is stored to the memory 30 is the user data ($data_1$, etc.) including the associated $ECC_{inner}$ (and any other auxiliary data that is to be protected by the error coding scheme) and the $ECC_{outer}$ codes. The $ECC_{outer}$ codes may be stored in a dispersed manner with the user data or be stored as a compact data set.

FIG. 3 shows one cycle of the error correction process. In a low error rate state, the error correction cycle may be performed only once, and may not need to be completely performed. When the error rate is sufficiently low that each of the sectors ($data_1$, etc.) can be corrected by the associated $ECC_{inner}$, there is no need to proceed further than the first estimate of the data ($e_1 data_1$, etc.) as the $ECC_{inner}$ codes have detected and corrected all of the errors.

However, let us assume that the number of errors is sufficient large in one or more sectors such that all of the sectors are not represented by correct data. The $e_1 data_1$ ... data is processed by the RCC encoder so as to result in a computed estimated (e.g., $e_1 RCC_a$) RCC check bit pattern. This is the first estimate of the RCC check bit pattern that had been computed on the data before the data had been stored or transmitted. But, due to the errors in the recovered data, the estimated RCC data has some errors with respect to the computed RCC (which was not stored). An updated estimate of the estimated RCC check bit pattern (e.g., $e_2 RCC_a$) is computed by applying the previously stored $ECC_{outer}$ codes (which may be themselves protected by another code) to the appropriate estimated RCC check bit extent. Where the number of bits in error in a particular check bit extent is within the correction capability of the $ECC_{outer}$, then the errored bits in that RCC extent are corrected. Where this cannot be done, the error bits remain in the estimate. This is the second estimate of the original computed RCC check bits, and may still have errors.

However, some bits have been corrected. This updated RCC estimate is inverted by the decoder, as previously described, and where sufficient information is available from the newly corrected check bits, the underlying sector data (e.g., $data_1$) may be further corrected. Indeed, when the error correction has proceeded such that the number of error bits in, for example $data_1$ is less than $T_s$ then all of the remaining errored bits can be corrected using the sector BCH. This process results in an update of the $e_1 data_1$, for example to $e_2 data_1$ (not shown) and the process is continued. Since $e_2 data_1$ has fewer errors than $e_1 data_1$, $e_2 data_1$ represents a better estimate of the originally stored data, and when further processed to yield another set of estimated RCC check bits, those check bits are a better estimate of the correct RCC computed on the data prior to storage of the data.

The process may complete when the estimated RCC has no more errors, indicating that the underlying estimate of the data has no more errors, and thus representing a correct version of the data that was originally stored. Of course the process may have terminated earlier as the inner codes may have resulted in complete correction of the errors.

The discussion above was not intended to place any limitation as the physical location of any one of, or any group of, extents of the data or the error correcting codes associated with the data. The data and the associated error correcting codes may be stored anywhere in a memory system and be retrieved and processed by the memory system in a variety of configurations being consistent with the processing of such data. The system and method may be used also with RAIDed data configurations or any other error correction codes such as erasure codes, or combinations of codes.

It will be appreciated that the methods described and the apparatus shown in the figures may be configured or embodied in machine-executable instructions; e.g., software, hardware, or in a combination of both. The instructions can be used to cause a general-purpose computer, a special-purpose processor, such as a DSP or array processor, an application specific integrated circuit (ASIC), a field programmable gate array (FPGA) or the like, that is programmed with the instructions to perform the operations described. Alternatively, the operations might be performed by specific hardware components that contain hardwired logic or firmware instructions for performing the operations described, or may be configured to so, or by any combination of programmed computer components and custom hardware components, which may include analog circuits.

The methods may be provided, at least in part, as a computer program product that may include a non-volatile machine-readable medium having stored thereon instructions which may be used to program a computer (or other electronic devices), or a FPGA, or the like, to perform the methods. For the purposes of this specification, the terms "machine-readable medium" shall be taken to include any medium that is capable of storing or encoding a sequence of instructions or data for execution by a computing machine or special-purpose hardware and that cause the machine or special purpose hardware to perform any one of the methodologies or functions of the present invention. The term "machine-readable medium" shall accordingly be taken include, but not be limited to, solid-state memories, optical and magnetic disks, magnetic memories, optical memories, or other functional equivalents. The computer program product may be stored or distributed on one medium and transferred or re-stored on another medium for use.

For example, but not by way of limitation, a machine readable medium may include: read-only memory (ROM); random access memory (RAM) of all types (e.g., S-RAM, D-RAM); programmable read only memory (PROM); electronically alterable read only memory (EPROM); magnetic random access memory; magnetic disk storage media; FLASH; or, other memory type that is known or will be developed, and having broadly the same functional characteristics.

Furthermore, it is common in the art to speak of software, in one form or another (e.g., program, procedure, process, application, module, procedure, or logic), as taking an action or causing a result. Such expressions are merely a convenient way of saying that execution of the software by a computer or equivalent device causes the processor of the computer or the equivalent device to perform an action or a produce a result, as is well known by persons skilled in the art.

While the methods disclosed herein have been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A method of storing data, the method comprising:
dividing a chunk of data into a plurality of segments;
computing redundant data for each of the plurality of segments using a first code type;
computing redundant data for the chunk of data using a second code type;
computing redundant data for the redundant data of the chunk of data using a third code type; and,
storing the plurality of segments, the redundant data of each of the plurality of segments, and the redundant data for the redundant data of the chunk of data, wherein the computed redundant data for the chunk of data is not stored.

2. The method of claim 1, wherein the first, the second and the third code types are a same code type.

3. The method of claim 1, wherein at least two of the code types are a same code type.

4. The method of claim 1, wherein at least one of the first, the second or the third code type is a Bose-Chaudhuri-Hocquenghem (BCH) code.

5. The method of claim 1, wherein at least one of the first, the second or the third code type is a low density parity code (LDPC).

6. A method of retrieving data, the method comprising:
receiving a chunk of data, the chunk of data comprising a plurality of segments of data, each segment of data having associated redundant data, and redundant data for redundant data for the chunk of data, but not including the redundant data for the chunk of data;
correcting the segments of data using the associated redundant data for each segment;
determining if all errors in the chunk of data have been corrected; and:
if all of the errors in the chunk of data have been corrected, output the data of the chunk of data;
else:
computing an estimate of the redundant data for the chunk of received data using a same procedure as was used to previously compute the redundant data for the chunk of data;
correcting the estimate of the redundant data using the redundant data for the redundant data of the chunk of data;
using the same procedure used to compute the redundant data of the chunk of data and the estimate of the redundant data to correct the chunk of data;
correcting the segments of data using the associated redundant data for each segment; and,
repeating until no errors remain in the segments of data.

7. The method of claim 6, wherein the step of receiving the data includes receiving the chunk of data by reading the data from a memory circuit.

8. The method of claim 6, wherein the step of receiving the data includes accepting data from a receiving circuit.

9. A memory system, comprising:
a memory module having an interface and a memory circuit;
a first data redundancy computation unit, configured to compute redundant data for each one of a plurality of data segments of a chunk of data;
a second data redundancy computation unit, configured to compute redundant data for the chunk of data; and,
a third data redundancy computation unit configured to compute redundant data for the redundant data of the chunk of data,
wherein the chunk of data, the redundant data for the data segments of the chunk of data and the redundant data for the redundant data of the chunk of data are stored in the memory circuit, and the redundant data for the chunk of data is not stored in the memory circuit.

10. The memory system of claim 9, wherein the chunk of data, the redundant data for the data segments of the chunk of data, and the redundant data for the redundant data of the chunk of data are read from the memory circuit, further comprising:
an error correcting unit configured to correct errors in the data read from the memory circuit using the redundant data for the data segments and the redundant data for the redundant data of the chunk of data.

11. The memory system of claim 10, wherein the redundant data for the data segments is used to correct errors in each segment of the chunk of data.

12. The memory system of claim 11, wherein the second redundancy computation unit is used to compute an estimate of the redundant data of the chunk of data using the data of each segment.

13. The memory system of claim 11, wherein the estimate of the redundant data of the chunk of data is corrected using the redundant data of the redundant data of the chunk of data.

14. The memory system of claim 13, wherein the corrected redundant data of the redundant data of the chunk of data is used to correct the data of the chunk of data.

15. A computer program product stored on a non-volatile computer readable medium, comprising:
instructions to be executed by a processor for:
dividing a chunk of data into a plurality of segments;
computing redundant data for each of the plurality of segments using a first code type;
computing redundant data for the chunk of data using a second code type;
computing redundant data for the redundant data of the chunk of data using a third code type; and,
storing or transmitting the plurality of segments, the redundant data of each of the plurality of segments, and the redundant data for the redundant data of the chunk of data,
wherein the redundant data for the chunk of data is not stored or transmitted.

16. A computer program product stored on a non-volatile computer readable medium, comprising:
instructions to be executed by a processor for:
receiving a chunk of data, the chunk of data comprising a plurality of segments of data, each segment of data having associated redundant data, and redundant data for redundant data for the chunk of data, but not including the redundant data for the chunk of data;
correcting the segments of data using the associated redundant data for each segment;
determining if all errors in the chunk of data have been corrected; and:
if all of the errors in the chunk of data have been corrected, output the data of the chunk of data;
else:
computing an estimate of the redundant data for the chunk of received data using a same procedure as was used to previously compute the redundant data for the chunk of data;
correcting the estimate of the redundant data using the redundant data for the redundant data of the chunk of data;
using the same procedure used to compute the redundant data of the chunk of data and the estimate of the redundant data to correct the chunk of data;
correcting the segments of data using the associated redundant data for each segment; and,
repeating until no errors remain in the segments of data.

17. A method of storing data, the method comprising:
dividing a chunk of data into a plurality of segments;
computing redundant data for each of the plurality of segments using a first code type;
computing redundant data for the chunk of data using a second code type;
computing redundant data for the redundant data of the chunk of data using a third code type; and,
transmitting the plurality of segments, the redundant data of each of the plurality of segments, and the redundant data for the redundant data of the chunk of data,
wherein the computed redundant data for the chunk of data is not transmitted.

18. The method of claim 17, wherein the first, the second and the third code types are a same code type.

19. The method of claim 17, wherein at least two of the code types are a same code type.

20. The method of claim 17, wherein at least one of the first, the second or the third code type is a Bose-Chaudhuri-Hocquenghem (BCH) code.

21. The method of claim 17, wherein at least one of the first, the second or the third code type is a low density parity code (LDPC).

* * * * *